United States Patent [19]
Yi et al.

[11] Patent Number: 5,901,055
[45] Date of Patent: May 4, 1999

[54] INTERNAL BOOSTED VOLTAGE GENERATOR OF SEMICONDUCTOR MEMORY DEVICE

[75] Inventors: Chul-woo Yi; Hoon Choi, both of Seoul, Rep. of Korea

[73] Assignee: Samsung Electronics Co., Ltd., Suwon, Rep. of Korea

[21] Appl. No.: 08/915,220

[22] Filed: Aug. 20, 1997

[30] Foreign Application Priority Data

Aug. 20, 1996 [KR] Rep. of Korea ................. 96-34525

[51] Int. Cl.$^6$ ............................................. H02M 3/18
[52] U.S. Cl. ................................................ 363/60; 327/536
[58] Field of Search ............................ 365/189.11, 226; 327/541, 536; 363/60; 307/110

[56] References Cited

U.S. PATENT DOCUMENTS 4,703,196  10/1987  Arakawa et al. .................... 327/541
5,367,489  11/1994  Park et al. ........................... 327/537

*Primary Examiner*—Shawn Riley
*Attorney, Agent, or Firm*—Marger Johnson & McCollom, P.C.

[57] ABSTRACT

An internal boosted voltage generator for a semiconductor memory device eliminates excessive increases in boosted voltage and reduces current consumption even though the power supply voltage increases. The internal boosted voltage generator includes a pumping portion for pumping a signal from an output node in response to a control signal, a precharging portion for precharging the output node of the pumping portion, and a controlling portion interposed between the pumping portion and the precharge portion. The controlling portion is a pulse generator that varies the precharge time of the precharging portion by varying the pulse with of an output signal according to the power supply voltage. The output signal of the controlling portion has a relatively narrow pulse width at high power supply voltages and a wider pulse width at low power supply voltages. Therefore, the device is not exposed to excessive stress even though the power supply voltage increases greatly.

9 Claims, 4 Drawing Sheets

INTERNAL BOOSTED VOLTAGE GENERATOR OF SEMICONDUCTOR MEMORY DEVICE

This application corresponds to Korean patent application No. 96-34525 filed Aug. 20, 1996 in the name of Samsung Electronics Co. Ltd., which is herein incorporated by reference for all purposes.

BACKGROUND OF THE INVENTION

1. Field of the Invention

The present invention relates to an internal boosted voltage generator for a semiconductor memory device, and more particularly, to an active kicker for an internal boosted voltage generator.

2. Description of the Related Art

PNP type sense amplifiers have been used in conventional semiconductor memory devices. Recently, however, shared NP type sense amplifiers have been used to reduce chip size in semiconductor memory devices having high integration levels. Shared NP type sense amplifiers require a boosted voltage $V_{pp}$ for preventing data having a logic level of "1" from being lost during an active restore process due to the threshold voltage drop $V_t$ in an NMOS isolation transistor which isolates the bit line and the sense amplifier. Thus, an internal boosted voltage generator for generating the boosted voltage (hereinafter referred to as a "$V_{pp}$ generator") is required. The $V_{pp}$ generator is also used for word line drivers and a data output buffers, thereby improving the speed of the memory device.

The $V_{pp}$ generator is comprised of a main pump and an active kicker, wherein the main pump is for filling a $V_{pp}$ charge tank during a power-up state, and the active kicker, which is the subject of the present invention, is for supplementing the charge consumed during an active cycle.

FIG. 1 is a circuit diagram of a conventional active kicker. Referring to FIG. 1, the active kicker includes pumping means 10, precharging means 20 for precharging an output node N<bst> of the pumping means 10, and transferring means N3 for transferring the charge from the output node N<bst> to a node N<$V_{pp}$>.

The pumping means 10 includes an inverter I2 and a capacitor C0 connected between an output node N<pump> of the inverter I2 and the output node N<bst> thereof. The input port of the inverter I2 is connected to an output node N<1> of an inverter I1 for inverting a control signal φAKE.

The precharging means 20 includes an NMOS precharge transistor N2 having a source connected to the output node N<bst> of the pumping means 10 and a drain connected to a power supply voltage $V_{cc}$, an NMOS transistor N1 having a source connected to a gate of the NMOS precharge transistor N2, that is, node N<pre>, and a gate and a drain both connected to the power supply voltage $V_{cc}$. The precharging means 20 further includes a capacitor C2 that has one terminal connected to the node N<pre> and another terminal connected to the output node N<1> of the inverter I1. An internal power supply voltage IVC is used as the power supply voltage $V_{cc}$, although an external power supply voltage may be used instead.

The transferring means N3 is comprised of an NMOS transistor having a drain connected to the output node N<bst> of the pumping means 10, a gate connected to a control signal φTRAN and a source connected to the node N<$V_{pp}$>.

In FIG. 1, C1, $C_{pp}$ and $C_{cs}$ represent parasitic capacitors. A switch is included for supplementing $C_{cs}$ by providing a consumed charge $Q_{cs}$ from the node N<$V_{pp}$>.

FIG. 2 is an operational timing diagram of the active kicker shown in FIG. 1. Referring to FIG. 2, the operational principle of the conventional active kicker shown in FIG. 1 will be described. If the control signal φAKE is initially in a logic "low" state, the node N<1> goes "high" to boost the node N<pre>, so that the node N<bst> is precharged to the level of the power supply voltage $V_{cc}$. Then, if the control signal φAKE is enabled to a "high" state, the precharge path is disabled, and the node N<pump> goes "high" so that the voltage of the node N<bst> is boosted to a predetermined level (hereinafter referred to as "$V_{bst}$"). Then, the control signal φTRAN is enabled to a "high" state to supplement the charge $Q_{cs}$ consumed during the active cycle through charge sharing between the node N<bst> and the node N<$V_{pp}$>. The items induced based on the above concept can be expressed as follows.

$$V_{bst}=V_{cc}+V_{cc}\times C0/(C0+C1)\approx 2V_{cc} \quad (1)$$

$$V_{pp}=V_{cc}\times 2C0/(C0+C_{cs}) \quad (2)$$

$$Q_{sp}=C0\times(V_{bst}-V_{pp}) \text{ or } C_{pp}\times(V_{pp}-V_{cs})\approx C0\times(2V_{cc}-V_{pp}) \quad (3)$$

$$Q_{cs}=V_{pp}\times(C_{pp}\times C_{cs})/(C_{pp}+C_{cs})-V_{cc}\times C_{cs}/2\approx C_{cs}\times(V_{pp}-V_{cc}/2) \quad (4)$$

wherein $V_{bst}$ represents the voltage level of the node N<bst>, $V_{pp}$ represents the voltage level of the node N<$V_{pp}$>, $Q_{sp}$ represents supplied charge, and $Q_{cs}$ represents consumed charge, respectively.

Hereinafter, problems associated with the conventional active kicker shown in FIG. 1 will be described with reference to FIGS. 3 and 4.

FIG. 3 is a clamp curve of IVC and $V_{pp}$ with respect to the external power supply voltage $EV_{cc}$. IVC represents the output voltage of an internal voltage converter, that is, an internal power supply voltage, and $V_{pp}$, as a boosted voltage, represents the voltage of the node N<$V_{pp}$> shown in FIG. 1. For comparison, FIG. 1 also shows $V_{pp}'$ which represents the voltage of the node N<$V_{pp}$> of an active kicker in accordance with the present invention which is described below with reference to of FIG. 5. However, for purposes of explaining the problems associated with the conventional active kicker, the following discussion will only refer to the signals associated with the circuit shown in FIG. 1.

Generally, the difference between IVC and $V_{pp}$ is optimally set to about 2.5 V which is lower than the target operational voltage of 3.0 V for low $V_{cc}$ margin. Assuming that the optimal difference between $V_{pp}$ and IVC is Δ0 when IVC is increased from 2.5 V to 3.0 V, the difference A between the changed $V_{pp}$ and IVC (referred to as Δ1) can be expressed as follows, based on the above-referenced formula (2):

$$V_{pp}(3.0\ V)-V_{pp}(2.5\ V)=2C0/(C0+C_{cs})\times \Delta V_{cc}\approx 1.6\times \Delta V_{cc} \quad (5)$$

$$\Delta 1-\Delta 0=[2C0/(C0+C_{cs})-1]\times \Delta V_{cc}\approx 0.6\times \Delta V_{cc} \quad (6)$$

As shown from the above formulas, since the change in $V_{pp}$ is greater than that of $V_{cc}$, that is, IVC, e.g., greater than about 1.6 times $\Delta V_{cc}$, $V_{pp}$ is greatly increased when IVC is necessarily increased to 5 V or higher as required in the case where a burn-in-mode for testing the reliability of the semiconductor memory device is required. As a result, severe stress applied to the device. In addition, the large amount of charge required to increase $V_{pp}$ results in excessive current consumption.

FIG. 4 is a conceptual curve of the supplied charge $Q_{sp}$ and the consumed charge $Q_{cs}$ according to the change in $V_{pp}$. Solid lines are for the conventional active kicker shown in FIG. 1. For comparison, dashed lines illustrate the operation of an active kicker in accordance with the present invention which is described below with reference to of FIG. 5. However, for purposes of explaining the problems associated with the conventional active kicker, the following discussion will only refer to the curves associated with the circuit shown in FIG. 1.

Referring to FIG. 4, in view of the active kicker, it is desirable that $Q_{sp}$ and $Q_{cs}$ have the same value so that the X-axis value of a point where two curves intersect with each other is at an optimum $V_{pp}$. The above-described problems of the conventional active kicker are apparent from FIG. 4, that is, as $V_{cc}$ increases, the optimum $V_{pp}$ is greatly increased.

SUMMARY OF THE INVENTION

It is an object of the present invention to provide an internal boosted voltage generator for a semiconductor memory device, particularly, an active kicker, in which a boosted voltage $V_{pp}$ is changed by $\Delta$ as the power supply voltage $V_{cc}$ is changed by $\Delta$, so that the excessive increase of $V_{pp}$ is suppressed, thereby preventing the device from being exposed to excessive stress when $V_{cc}$ is increased to a high level.

A further object of the present invention is to reduce current consumption associated with an active kicker.

To achieve these and other objects, there is provided an internal boosted voltage generator of a semiconductor memory device comprising: pumping means for pumping a signal of an output node in response to a control signal; precharging means for precharging the output node of the pumping means; and controlling means interposed between the pumping means and the precharge means for variably controlling the precharge time of the precharging means according to a power supply voltage.

Preferably, the controlling means is a pulse generator for generating an output signal having a pulse width which is varied in accordance with the power supply voltage by receiving the control signal, and the output signal of the controlling means has a relatively narrower pulse width at a high power supply voltage and wider pulse width at a low power supply voltage.

Therefore, with an internal boosted voltage generator constructed in accordance with the present invention, excessive increases in $V_{pp}$ are suppressed when $V_{cc}$ is increased to a high level so that excessive stress is not applied to the device, and current consumption is reduced.

BRIEF DESCRIPTION OF THE DRAWINGS

The above object and advantages of the present invention will become more apparent by describing in detail a preferred embodiment thereof with reference to the attached drawings in which.

DESCRIPTION OF THE PREFERRED EMBODIMENT

Figure 5:
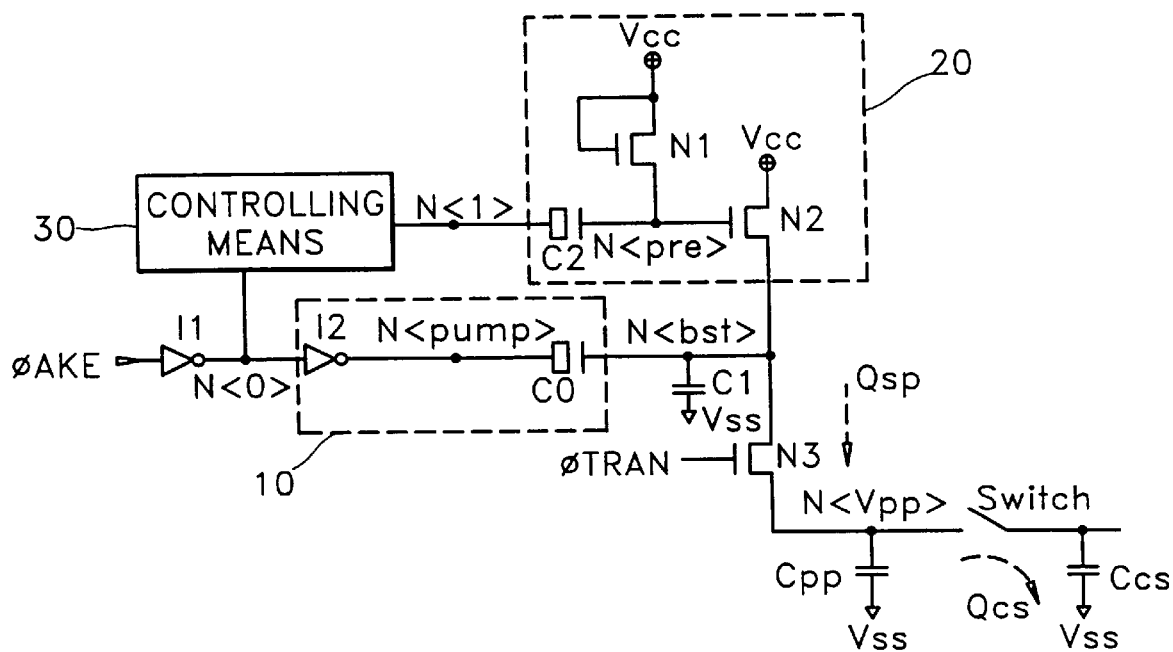
FIG. 5 is a circuit diagram of a preferred embodiment of an active kicker according to the present invention.

FIG. 5 is a circuit diagram of a preferred embodiment of an active kicker according to the present invention. Portions of the circuit in FIG. 5 that correspond to similar portions of the conventional active kicker shown in FIG. 1 are represented by the same reference numerals.

Referring to FIG. 5, an active kicker in accordance with the present invention includes pumping means 10, precharging means 20 for precharging an output node N<bst> of the pumping means 10, controlling means 30 for controlling the precharging time of the precharging means 20 according to a power supply voltage $V_{cc}$, and transferring means N3 for transferring charge from the output node N<bst> of the pumping means to a node N<$V_{pp}$>.

Figure 1:
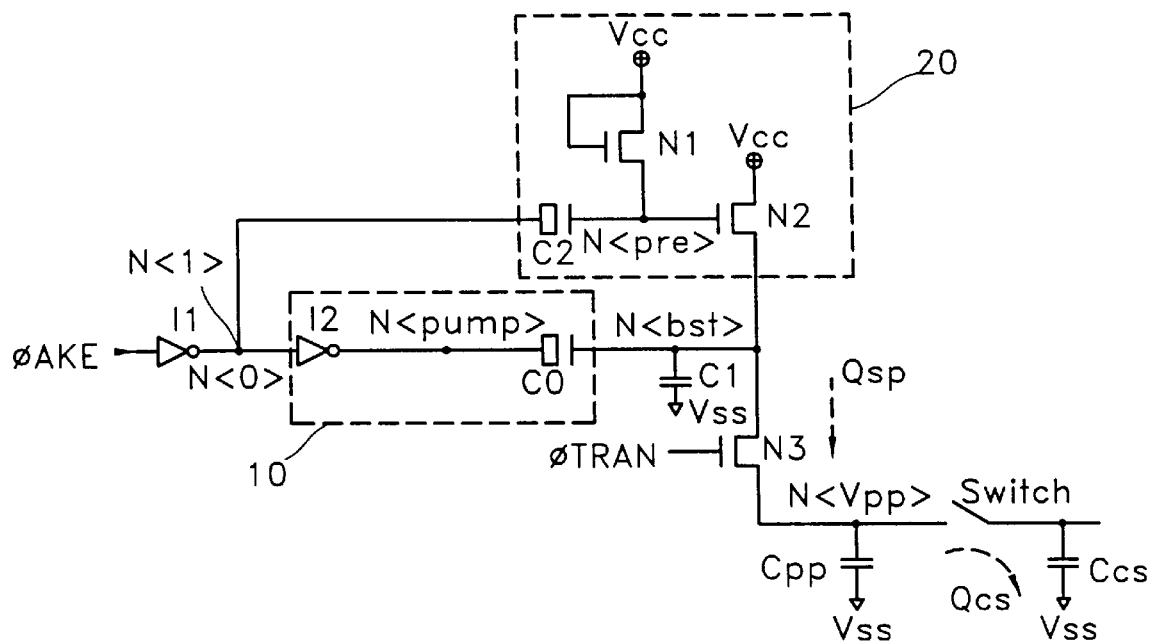
FIG. 1 is a circuit diagram of a conventional active kicker.
Figure 2:
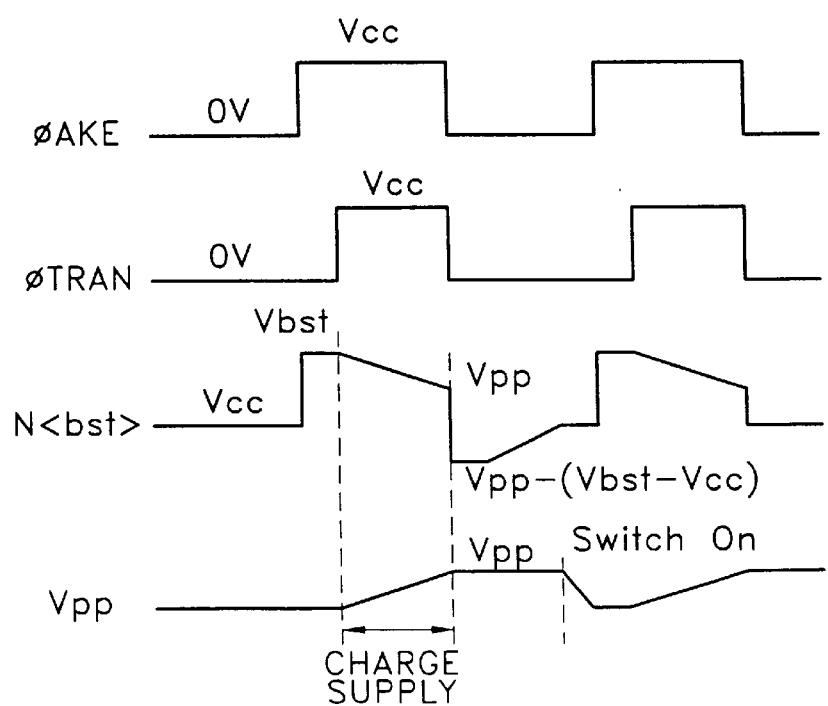
FIG. 2 is an operational timing diagram of the active kicker shown in FIG. 1.

The pumping means 10 is comprised of an inverter I2 and a capacitor C0 connected between an output node N<pump> of the inverter I2 and the output node N<bst> in the same manner as the pumping means of the conventional active kicker shown in FIG. 1. An input port of the inverter I2 is connected to an output node N<0> of an inverter I1 for inverting a control signal $\phi$AKE.

The precharging means 20 is comprised of an NMOS transistor N2 having a source connected to the output node N<bst> of the pumping means 10 and a drain connected to the power supply voltage $V_{cc}$, an NMOS transistor N1 having a source connected to a gate of the NMOS transistor N2, that is, a node N<pre>, and a gate and a drain both connected to the power supply voltage $V_{cc}$. The precharging means 20 is further comprised of a capacitor C2 that has one terminal connected to the node N<pre> and another terminal connected to an output node N<1> of the controlling means 30. The controlling means 30 has an input port connected to the output node N<0> of the inverter I1.

The transferring means N3 is comprised of an NMOS transistor N3 having a drain connected to the output node N<bst> of the pumping means 10, a gate connected to a control signal $\phi$TRAN and a source connected to the node N<$V_{pp}$>.

C1, $C_{pp}$ and $C_{cs}$ represent parasitic capacitors. A switch is included for supplementing $C_{cs}$ by providing consumed charge $Q_{cs}$ from the node N<$V_{pp}$>.

Figure 6:
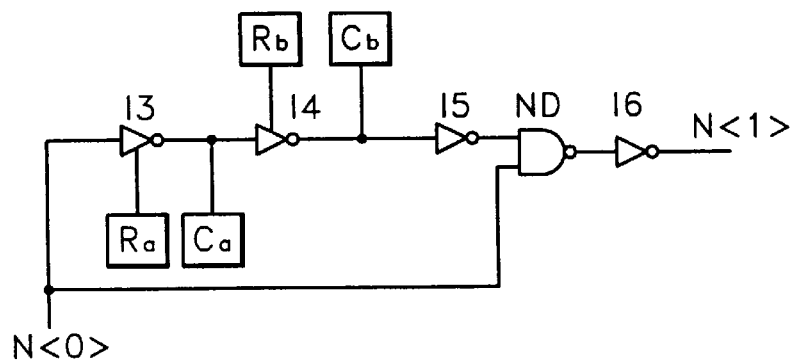
FIG. 6 is a circuit diagram of the controlling means shown in FIG. 5.

FIG. 6 is a circuit diagram of an embodiment of the controlling means shown in FIG. 5. Referring to FIG. 6, the controlling means includes an inverter I3 for inverting a signal input through the node N<0>. A resistor $R_a$ is connected between an NMOS transistor of the inverter I3 and a ground terminal $V_{ss}$. A capacitor $C_a$ is connected between the output port of the inverter I3 and ground $V_{ss}$. An inverter I4 is connected for inverting an output signal from the inverter I3. A resistor $R_b$ is connected between a PMOS transistor of the inverter I4 and a power supply voltage $V_{cc}$. A capacitor $C_b$ is connected between the output port of the inverter I4 and the power supply voltage $V_{cc}$. An inverter I5 is connected for inverting an output signal from the inverter I4. A NAND gate ND is connected for performing a NAND operation by receiving the output signal of the inverter I5 and the signal input through the node N<0>. An inverter I6 is connected for inverting an output signal from the NAND gate ND and outputting the inverted signal to the output node N<1>.

The controlling means functions as an automatic pulse generator by receiving the signal from the node N<0> and outputting a precharge pulse to the output node N<1>, wherein the precharge pulse is relatively narrow in width when $V_{cc}$ is high, and is relatively wide in width when $V_{cc}$ is low.

Figure 7:
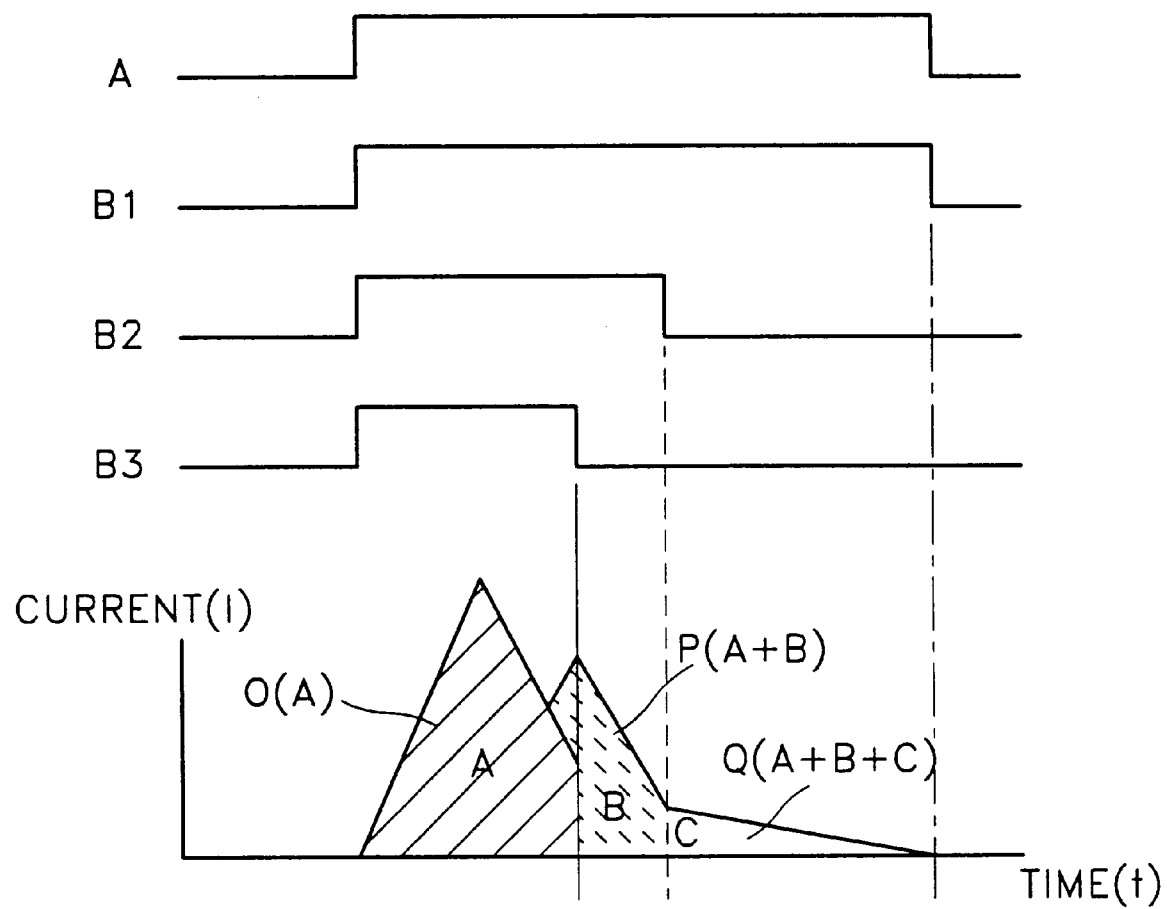
FIG. 7 is a diagram showing differences in the amount of precharge caused by precharge pulses in the circuits of FIGS. 1 and 5.

FIG. 7 is a diagram showing differences in the amount of precharge produced by the precharge pulses of the conventional circuit of FIG. 1 as well as the embodiment of the present invention as shown in FIG. 5. Here, a positive pulse width represents a precharge time.

Pulse A represents a precharge pulse of the conventional active kicker shown in FIG. 1, which is a signal output from the node N<1> of FIG. 1 and is the same at all levels of $V_{cc}$. Pulses B1 to B3 represent precharge pulses of the active kicker shown in FIG. 5 according to the present invention, which are signals output from the node N<1> of FIG. 5 and are generated by the controlling means of FIG. 6.

The pulse B1 is a signal at $V_{cc}$=2.5 V of $V_{cc}$, the pulse B2 is a signal at $V_{cc}$=2.75 V, and the pulse B3 is a signal at $V_{cc}$=3.0 V. As shown here, the pulse width is relatively narrow at a high $V_{cc}$ and relatively wider at a low $V_{cc}$.

Also, the current graph shown in FIG. 7 represents current I flowing through the NMOS transistor N2 of the precharging means 20 shown in FIG. 5. Here, O represents the amount of precharge at $V_{cc}$=3.0 V, P represents the amount of precharge at $V_{cc}$=2.75 V, and Q represents the amount of precharge at $V_{cc}$=2.5, respectively. As illustrated by this graph, the precharge time becomes shorter as the $V_{cc}$ as increases, thereby gradually reducing the amount of precharge.

Figure 3:
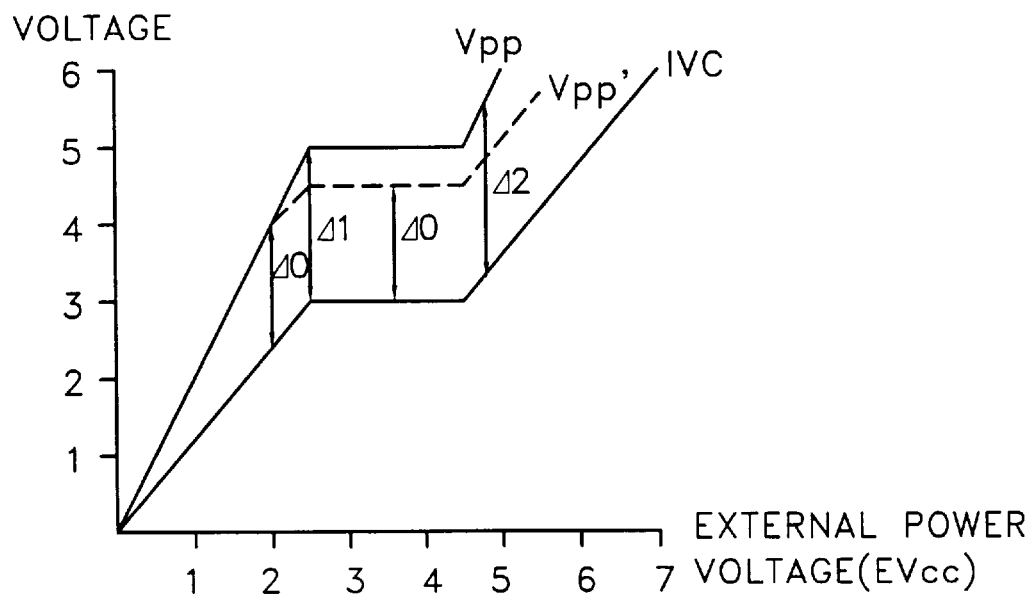
FIG. 3 is a clamp curve of an internal power voltage IVC and a boosted voltage $V_{pp}$ with respect to the external power supply voltage $EV_{cc}$ for the circuits of FIGS. 1 and 5.

The active kicker of the present invention shown in FIG. 5 will now be described in more detail with reference to FIGS. 3, 4 and 7.

From formulas (5) and (6) above, it is apparent that, in order to change $V_{pp}$ by $\Delta$ together with $V_{cc}$, the value of $2C0/(C0+C_{cs})$ should converge on "1" as $V_{cc}$ increases. That is, the capacitance C0 should converge on the capacitance $C_{cs}$. Here, C0 serves to determine the precharge amount and the boosting ratio determines the amount of the supplied charge $Q_{sp}$, where C0 is greater than $C_{cs}$. Thus, the convergence of the capacitance C0 on the capacitance $C_{cs}$ reduces the charge to be supplied by reducing the amount of precharge or by lowering the boosting ratio.

To achieve the foregoing, an automatic pulse is gated to the precharge path or pumping path to make the width of the automatic pulse narrower at the high $V_{cc}$ and wider at the low $V_{cc}$.

With the active kicker of the present invention, the controlling means 30, i.e., an automatic pulse generator, is included in the precharge path, so that the signal of the output node N<1> of the controlling means 30, as the precharge pulse, is automatically varied according to $V_{cc}$, as shown in FIG. 7. That is, the pulse width of the precharge pulse becomes relatively narrower at a high $V_{cc}$ and wider at a low $V_{cc}$.

When the pulse width of the precharge pulse is determined, current I flowing through the NMOS transistor N2 of the precharge means 20 shown in FIG. 5 is then determined. As a result, as $V_{cc}$ increases, the pulse width is decreased and the amount of precharge is then decreased, thereby obtaining the effect of reducing the capacitance C0.

Figure 4:
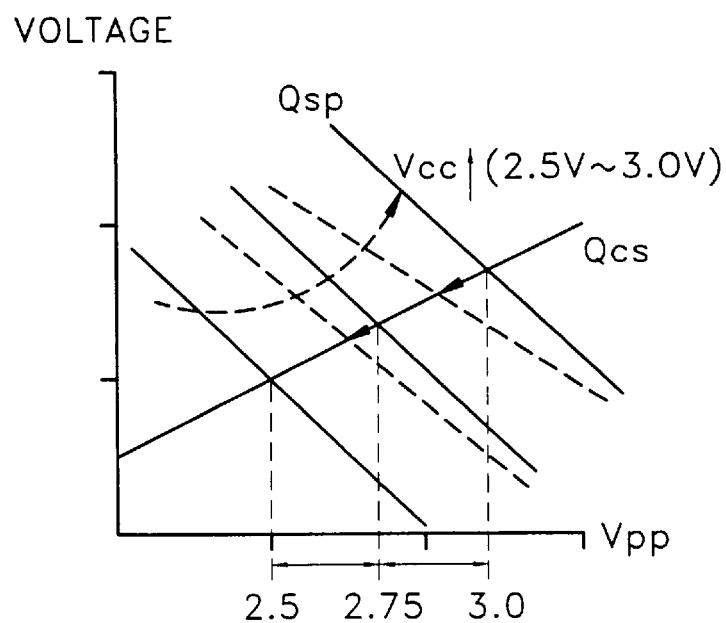
FIG. 4 is a conceptual curve of the supplied charge and the consumed charge according to changes in a boosted voltage ($V_{pp}$) for the circuits of FIGS. 1 and 5.

Accordingly, the slope of the supplied charge becomes shallower as represented by dashed lines of FIG. 4, that is, the optimum $V_{pp}$ is lowered. As a result, when $V_{pp}$ is changed by $\Delta$ together with $V_{cc}$ as represented by the dashed lines of FIG. 3, the clamp curve $V_{pp}'$ at which the voltage difference is maintained at $\Delta 0$ is obtained.

Therefore, an the internal boosted voltage generator for a semiconductor memory device according to the present invention, $V_{pp}$ is changed by $\Delta$ as $V_{cc}$ changes by $\Delta$, so that the excessive increases in $V_{pp}$ are suppressed. As a result, excessive stress to the device is prevented even though $V_{cc}$ increases greatly, and current consumption is decreased.

The present invention is not limited to the particular forms illustrated and further modifications and alternations will occur to those skilled in the art within the spirit and scope of this invention.

What is claimed is:

1. An internal boosted voltage generator for use in a semiconductor memory device, the voltage generator comprising:

an output node coupled to a circuit in the memory device;

charge pumping means controllably coupled to the output node for generating a precharge current for providing replacement charge to the output node in response to a control signal;

precharging means connected to the output node for precharging the output node; and controlling means interposed between the charge pumping means and the precharge means, for controlling the precharging means such that the precharging means turns on for an amount time that varies responsive to a power supply voltage.

2. The internal boosted voltage generator of claim 1, wherein the controlling means includes a pulse generator for generating an output signal having a pulse width which is varied in accordance with the power supply voltage by receiving the control signal.

3. The internal boosted voltage generator of claim 2, wherein the controlling means includes means for controlling the pulse generator so as to provide an output signal from the pulse generator that varies inversely in response to the power supply voltage, thereby limiting the amount of precharge current.

4. A method of limiting replacement current in a boosted voltage generator circuit, the method comprising the steps of:

monitoring a power supply voltage;

applying a series of voltage pulses to a boosted voltage node for precharging the boosted voltage node; and varying a duty cycle of the series of voltage pulses so as to control the voltage level of the boosted voltage node in response to the monitored power supply voltage.

5. A method according to claim 4 wherein said varying the duty cycle includes adjusting the duty cycle in inverse proportion to the monitored power supply voltage.

6. A method according to claim 5 wherein said applying a series of voltage pulses includes providing a precharge transistor connected between the boosted voltage node and the power supply, and applying the series of voltage pulses to the precharge transistor for controlling an on/off state of the precharge transistor.

7. An active kicker circuit comprising:

a charge pump having an output terminal coupled to an output node and an input terminal for receiving an active kicker enable signal, wherein the charge pump boosts the voltage of the output node responsive to the active kicker enable signal;

a precharge circuit having an output terminal coupled to the output node and an input terminal for receiving a pulse signal having a pulse width, wherein the precharge circuit precharges the output node responsive to the pulse signal; and a control circuit having an output terminal coupled to the input terminal of the precharge circuit for providing the pulse signal thereto, and an input terminal for receiving the active kicker enable signal, wherein the control circuit generates the pulse signal responsive to the active kicker enable signal, and wherein the control circuit varies the pulse width of the pulse signal responsive to a power supply voltage.

8. An active kicker circuit according to claim 7 wherein the control circuit includes:

an inverting delay circuit having an input terminal for receiving the active kicker enable signal, and an output terminal; and an AND gate having a first input terminal coupled to the output terminal of the delay circuit, a second input terminal for receiving the active kicker enable signal, and an output terminal for providing the pulse signal.

9. An active kicker circuit according to claim 8 wherein the delay circuit includes:

an inverter having an input terminal for receiving the active kicker enable signal, and an output terminal;

a resistor coupled between the inverter and a power supply terminal; and a capacitor coupled between the output terminal of the inverter and the power supply terminal.

\* \* \* \* \*

UNITED STATES PATENT AND TRADEMARK OFFICE
CERTIFICATE OF CORRECTION

PATENT NO.   : 5,901,055
DATED        : May 4, 1999
INVENTOR(S)  : Yi et al.

It is certified that error appears in the above-identified patent and that said Letters Patent is hereby corrected as shown below:

Column 2,
Line 48, please replace "the difference A" with -- the difference $\Delta$ --.

Signed and Sealed this

Thirtieth Day of April, 2002

Attest:

JAMES E. ROGAN
Attesting Officer
Director of the United States Patent and Trademark Office